US005688330A

United States Patent [19]
Ohmi

[11] Patent Number: 5,688,330
[45] Date of Patent: Nov. 18, 1997

[54] PROCESS APPARATUS

[76] Inventor: Tadahiro Ohmi, 1-17-301, Komegabukuro 2-chome, Aoba-ku Sendai-shi Miyagi-ken, Japan

[21] Appl. No.: 707,915

[22] Filed: Sep. 10, 1996

Related U.S. Application Data

[63] Continuation of Ser. No. 335,862, filed as PCT/JP93/00622 May 12, 1993, published as WO93/23978 Nov. 25, 1993.

[30] Foreign Application Priority Data

May 13, 1992 [JP] Japan .................... 4-146332

[51] Int. Cl.$^6$ .......................................... C23C 16/00
[52] U.S. Cl. ..................... 118/723 E; 204/298.06
[58] Field of Search .................. 118/723 MP, 723 E; 156/345; 216/71; 204/298.08, 298.34, 298.06

[56] References Cited

U.S. PATENT DOCUMENTS

| 4,464,223 | 8/1984 | Gorin | 156/643 |
| 5,272,417 | 12/1993 | Ohmi | 315/111.21 |

FOREIGN PATENT DOCUMENTS

| 0 474 348 A3 | 3/1992 | European Pat. Off. . | |
| 57-131374 | 8/1982 | Japan . | |
| 62-111431 | 5/1987 | Japan | H01L 21/302 |
| 62-125626 | 6/1987 | Japan . | |
| 62-274725 | 11/1987 | Japan | H01L 21/302 |
| 62-280378 | 12/1987 | Japan | C23F 4/00 |
| 1-100925 | 4/1989 | Japan . | |

OTHER PUBLICATIONS

European Search Report dated Mar. 9, 1995.

*Primary Examiner*—John Niebling
*Assistant Examiner*—Joni Y. Chang
*Attorney, Agent, or Firm*—Baker & Daniels

[57] ABSTRACT

A process apparatus whose chamber can be cleaned in a short time while not being exposed to air at all. First and second electrodes (107,105), are provided in a vacuum vessel (108). A first high-frequency power supply (112) having a first frequency is supplied to the first electrode (107), and a second high frequency power supply (101) having a second frequency different from the first frequency is provided. An impedance means and a means for connecting the second high frequency power supply to the second electrode are also provided. A means for supporting a wafer (106) is disposed on the second electrode (105), and a gas introduced into the vacuum vessel (108) is turned into a plasma by the first and second high-frequency powers. In this apparatus, a means for connecting the impedance means between the second electrode and earth during a cleaning mode of the apparatus is also provided whereby the impedance of the impedance means is made larger than the impedance between the first electrode and ground, when said impedance means is connected to said second electrode.

6 Claims, 4 Drawing Sheets

PROCESS APPARATUS

This is a continuation of application Ser. No. 08/335,862, filed as PCT/JP93/00622 May 12, 1993, published as WO93/23978 Nov. 25, 1993.

BACKGROUND OF THE INVENTION

1. Field of the Invention

This invention relates to a process apparatus. In more detail, it relates to a process apparatus having a high performance provided with a self cleaning mechanism.

2. Description of the Related Art

The prior art will be described with reference to FIG. 4.

FIG. 4 is a sectional view of a vacuum vessel of a general plasma CVD apparatus.

In FIG. 4, numeral 401 depicts a high-frequency generating apparatus, 402 an upper electrode, 403 a valve, 404 a high-frequency matching circuit, 405 a lower electrode, 406 a wafer, 407 a heater for heating the wafer, 408 a gas inlet, and 409 an evacuating port.

In this apparatus, the wafer surface is accumulated thereon, for example, with $SiO_2$ film, a method of which is to dispose the wafer 406 on the lower electrode through a gate valve from another vacuum vessel (not shown). The wafer 406 is heated, for example, at about 400° C. by the heater 407, and monosilane gas and oxygen gas are introduced thereto from the gas inlet 408. By means of the high-frequency generating apparatus 401, a high-frequency electric power, for example, having a frequency of 13.56 MHz is supplied on the upper electrode 402 to produce a plasma, then $SiO_2$ is accumulated on the wafer surface. At this time, the $SiO_2$ sticks not only on the wafer surface but also on all inside surfaces of the vacuum vessel. The $SiO_2$ adhered to the inside surface of the vacuum vessel increases with the increase of the number of sheets of wafers processed, thus it separates and then sticks on the wafer surface, a production yield is considerably lowered, for example, in semiconductor manufacturing.

To solve this problem, substances adhered to the inside surfaces of the vacuum apparatus are required to be removed by cleaning.

A method of cleaning in the prior art includes a wet cleaning and a dry cleaning, which are described as follows.

In the wet cleaning, the control proceeds to turn OFF the power supply to the heater 407, to lower a temperature of the lower electrode down to a room temperature, thereafter to close the valve 403 of the evacuating port, and to introduce argon gas or nitrogen gas from the gas inlet 408. By introducing the gas, the inside of the vacuum vessel is made into an atmospheric pressure from vacuum. After the inside of the vacuum vessel comes into the atmospheric pressure, gas supply from the gas inlet 408 is stopped and a cover (not shown) of the vacuum vessel is removed. Organic solvent such as isopropyl alcohol or ethanol or the like is suitably impregnated into cloth which hardly generates particles, and after the cloth is used to completely wipe and clean every nook and corner of the inside surface of the vacuum vessel, the cover is assembled on the vacuum vessel. Here, the control proceeds to open the valve 403 of the evacuating port, to evacuate the vacuum vessel, and to give a predetermined temperature to the lower electrode by turning ON the power supply of the heater 407. Furthermore, it is confirmed that a vacuum degree inside the vacuum vessel is equal to or less than a predetermined background.

In the dry cleaning, inert gas containing halogen group atoms such as F, Cl, and Br is introduced from the gas inlet 408 to produce a predetermined pressure inside the vacuum vessel. The high-frequency electric power having, for example, a frequency of 13.56 MHz is supplied to the upper electrode 402 by using the first high-frequency generating apparatus 401, thereby producing plasma to chemically activate the halogen group atoms. The activated halogen group atoms react with impurities adhered to the inside surface of the vacuum vessel and convert the impurities into a gas, which is then removed by an evacuating apparatus.

Each of the prior art described above has a problem as follows.

In the wet cleaning, a large problem resides in that substances adhered to the inside surface of the vacuum vessel are wiped and cleaned under the atmospheric pressure by the cloth in which organic solvent such as isopropyl alcohol or ethanol is impregnated. In detail, such wiping and cleaning works are performed under the atmospheric pressure, thereby moisture in the atmosphere sticks on the inside surface of the vacuum vessel, or the organic solvent impregnated into the cloth remains inside the vacuum vessel, or further, particles generated from the cloth are left inside the vacuum vessel. These residual impurities, when processing, provide disadvantages in contaminating the wafer, and in deteriorating a characteristic of the semiconductor device and so forth.

In the dry cleaning, plasma generated in the vacuum vessel is incapable of removing impurities adhered to every nook and corner of the inside of the vacuum vessel because of an insufficient spread of the plasma into the vacuum vessel. For this reason, when the amount of impurity or impurities adhered to the inside surface of the vacuum vessel increases, wet cleaning has been relied upon even though it includes the disadvantages as formerly described.

As described above, in the prior art, the particles or impurities remain inside the vacuum vessel during wet cleaning and thereby lower production yield in manufacturing semiconductors etc.

In addition, these cleaning works provide a serious problem in considerably deteriorating the availability or rate of operation of the apparatuses and in degrading a production efficiency in the manufacturing process lines.

An object of the invention is to provide a process apparatus capable of cleaning itself in a short time without ever exposing the apparatus chamber to the atmosphere.

SUMMARY OF THE INVENTION

The present invention discloses an apparatus comprising first and second electrodes provided in a vessel, a first high-frequency electric power supply having a first frequency is connected to the first electrode, a second high-frequency electric power supply having a second frequency different from the first frequency, a means for connecting said second high-frequency power supply to the second electrode, a means for holding a wafer disposed on the second electrode, a gas supply for introducing gas into the vessel whereby the gas is turned into a plasma, an impedance means, and a means for connecting the impedance means between the second electrode and earth in a cleaning mode of the apparatus, whereby the impedance of the impedance means is made larger than the impedance between the first electrode and earth when said impedance means is connected to the second electrode.

When the apparatus in which an impedance across a second electrode and the earth is made larger than an impedance across a first electrode and the earth, is operated, the plasma within the vacuum vessel spreads, chemically activated halogen group atoms spread into every nook and corner inside the vessel to react with impurities adhered to the inside surface of the vessel, and such impurities are turned into a gas, which can then be removed by an evacuating apparatus.

As a consequence, the impurities are removed, to an extent, from every nook and corner of the inside of the vessel.

Figure 1:
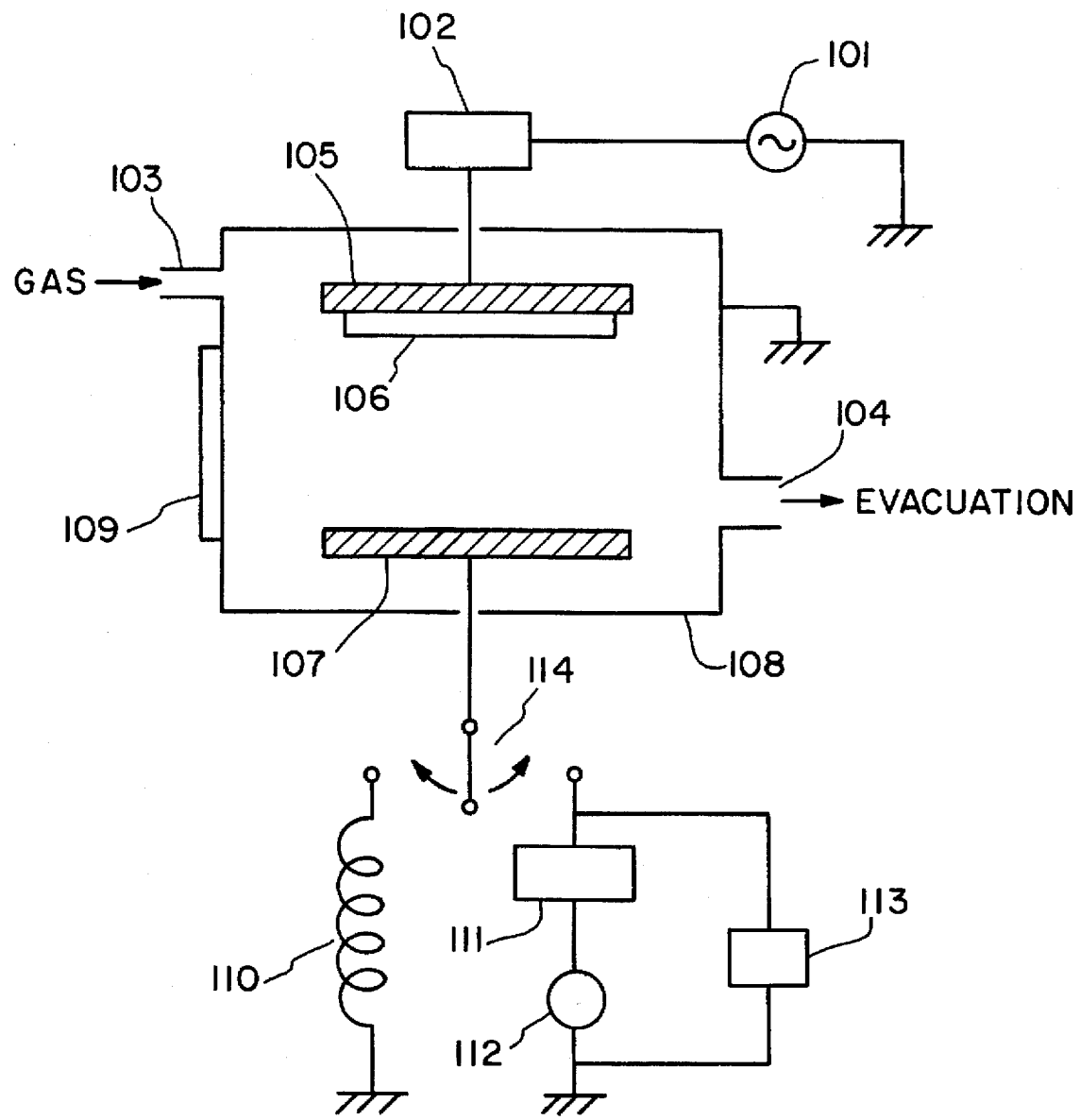
FIG. 1 is a typical view of a vacuum vessel of a semiconductor process apparatus according to a first embodiment.

Reference numeral 101 depicts a first high-frequency generating apparatus, 102 a first high-frequency matching circuit, 103 a gas inlet, 104 an evacuating port, 105 an upper electrode, 106 a target of silicon, 107 a lower electrode, 108 a vacuum vessel, 109 a flange, 110 a coil, 111 a second high-frequency matching circuit, 112 a second high-frequency generating apparatus, 113 a band-pass filter, 114 a turn switch, and 201 a capacitor.

DETAILED DESCRIPTION OF THE INVENTION

One embodiment according to the present invention is described referring to the drawings as follows.

FIG. 1 is a sectional view of an apparatus showing a first embodiment. In FIG. 1, 101 depicts a high-frequency generating apparatus, for example, having a frequency of 13.56 MHz, which is connected to an upper electrode 105. 102 depicts a high-frequency matching circuit. 103 depicts a gas inlet, for example, with a bore diameter of ¼ inches, which is made of SUS316L material and whose inside surface is processed by complex electrolytic polishing and oxide passivation processing. A gas usable for cleaning is, for example, $CF_4$, and a gas usable for wafer process purposes is, for example, monosilane gas or oxygen gas. 106 depicts a target material, which uses, for example, a silicon wafer with a diameter of 5 inches.

Numeral 108 depicts a depressurisable vacuum vessel, for example, made of SUS316L material and whose inside surface is processed by complex electrolytic polishing and oxide passivation processing and which has one edge formed in a hollowed 300 mm cubic box shape.

Numeral 104 depicts an evacuating port for evacuating the vacuum vessel 108. An evacuating apparatus uses, for example, a turbo molecular drag pump. 109 is a flange, for example, made of SUS316L material and whose inside surface is processed by complex electrolytic polishing and oxide passivation processing and which is formed into a disk shape with a diameter of 200 mm.

Numerals 105 and 107 depict upper and lower electrodes respectively, for example, each made of SUS316L having a surface processed by complex electrolytic polishing and oxide passivation processing and a diameter of 6 inches. 112 depicts a high-frequency generating apparatus, for example, having a frequency of 35 MHz and which is connected to the lower electrode 107. 111 depicts a high frequency matching circuit thereof. 113 depicts a band pass filter whose circuit is made of a coil and a capacitor and which makes the lower electrode a short circuit in a high-frequency manner for a first frequency, for example, 13.56 MHz during wafer processing. 110 depicts a coil, for example, made of copper, having a copper wire outer-diameter of 1 mm, a coil radius of 25 mm, a coil length of 300 mm, and 145 coil turns. This is equal to about $1.6 \times 10^{-4}$ H with an impedance of 100 kΩ for 100 MHz. 114 depicts a turn switch for connecting the lower electrode 107 to the high-frequency generating power supply 112-side or the coil 110-side.

The functions of the apparatus will now be described. In this apparatus, for example, Si sputtering is available. To achieve this, a silicon wafer is disposed on the lower electrode 107 through a gate valve from a vacuum vessel (not shown) connected to the vacuum vessel 108. The turn switch 114 is connected to the high-frequency generating apparatus 112 side, argon gas is introduced into the vacuum vessel 108 from the gas inlet 103 and a high-frequency electric power having a frequency of 1 to 15 MHz (13–56 MHz in this example) is applied to the upper electrode 105 from the high-frequency apparatus 101, and a plasma is thereby generated in the vacuum vessel 108. At this time, a wafer (not shown) set on the lower electrode 107 is heated by the heater, for example, at 300° C., and silicon target material 106 is biased, for example, by −300 V from the external for the earth (not shown). In this embodiment, the target material is biased, for example, using current in a direct-current. However, the foregoing is unnecessary depending on the frequency or the high-frequency electric power. This being the case, argon ions within the plasma sputter the silicon target material 106 and the sputtered Si is accumulated on the wafer disposed on the lower electrode 107. In this case, high-frequency generating apparatus 112, preferably a high-frequency electric power supply having a frequency of 30 to 50 MHz (35 MHz in this example), is supplied to the lower electrode 107 to self bias the wafer, for example, by +10 V, and the Si accumulated on the wafer then becomes a monocrystal. Thus, monocrystallization of Si at a low temperature is possible.

However, the sputtered Si sticks everywhere on the inside surface of the vacuum vessel 108 even in the present apparatus. As hereinbefore described in the prior art paragraph, such must be removed.

The examples of cleaning of the vacuum vessel 108 include the followings.

The turn switch 114 is connected to the coil 110 side, and gas, for example $CF_4$, is introduced from the gas inlet 103, and by the first high-frequency generating apparatus 101 a high-frequency electric power having, for example, a frequency of 100 MHz is imposed on the upper electrode 105 to generate plasma in the vacuum vessel 108. The plasma then spreads in the vacuum vessel 108 and impurity which is adhered to every nook and corner of the surface can be removed.

A reason why the plasma spreads into the vacuum vessel 108 in the embodiment is described as follows. During cleaning, the first high-frequency generating apparatus 101 uses, for example, 100 MHz, and for such 100 MHz, the vacuum vessel 108 has an impedance of 100 Ω for the effective earth. An impedance across the lower electrode and the earth is equal to 100 kΩ in this embodiment because the turn switch 114 is connected to the coil side on cleaning. Thus, when applying a high-frequency electric power on the upper electrode 105 by the first high-frequency generating apparatus 101, a high-frequency current hardly flows into the lower electrode 107, but easily flows into the inside wall of the vacuum vessel, this enables the plasma to spread.

As hereinbefore described, in this embodiment, impurities adhered to the inside surface of the vacuum vessel 108 can be removed without opening of the vacuum vessel 108 to the atmosphere. Hence, moisture in the atmosphere does not stick to the inside surface of the vacuum vessel 108, and the inside of the vacuum vessel 108 is not contaminated due to dust from the cloth used during wet cleaning operation, unlike the wet cleaning described in the prior art paragraph. The organic solvent impregnated in the cloth does not remain in the vacuum vessel 108.

Therefore, in the present invention, particles or impurities do not remain in the vacuum vessel 108, unlike the prior art. This considerably improves production yield during semiconductor manufacturing.

In the first embodiment, the shortened time required for cleaning is extremely shortened compared to wet cleaning.

According to the present invention, a rate of operation of the apparatus, which is of the same importance as the production yield of semiconductor manufacturing, can largely be upgraded.

In the first embodiment, the vacuum vessel 108, gas inlet 103, flange 109, upper electrode 105, and lower electrode 107 are, for example, made of SUS316L material and formed of inside surfaces and outer surfaces which are both processed by complex electrolytic polishing and oxide passivation processing. This protects the inside surface of the vacuum vessel from corrosion even during exposure to halogen atoms which are chemically activated during cleaning. In other embodiments of the invention, other materials may preferably be used such as, SUS316L, or aluminum processed, for example, of nickel plating, whose surfaces are treated with fluoridation process. Essentially, the present invention, allows any material, which does not corrode even when exposed to chemically activated halogen group atoms, to be used.

In the first embodiment, a turbo molecular drag pump is used for the evacuating apparatus. However, according to the invention, it is of course possible that other types of vacuum pumps may preferably be used depending on utilizations.

In the first embodiment, a silicon wafer with a diameter of 5 inches is used for the target material 106. However, in the invention, other materials may preferably be used depending on utilizations.

In the embodiment as described above, 100 MHz is given to the first frequency of the high-frequency electric power imposed by the first high-frequency generating apparatus 101. In the invention, a frequency equal to or more than 100 MHz may preferable be used (preferably a frequency of 100 to 200 MHz). During cleaning, by setting 100 MHz or more, an arisen smaller self spurious in the target 106 suppresses sputtering of the target 106 to satisfactorily prevent additional contamination during cleaning of the vacuum vessel.

Figure 3:
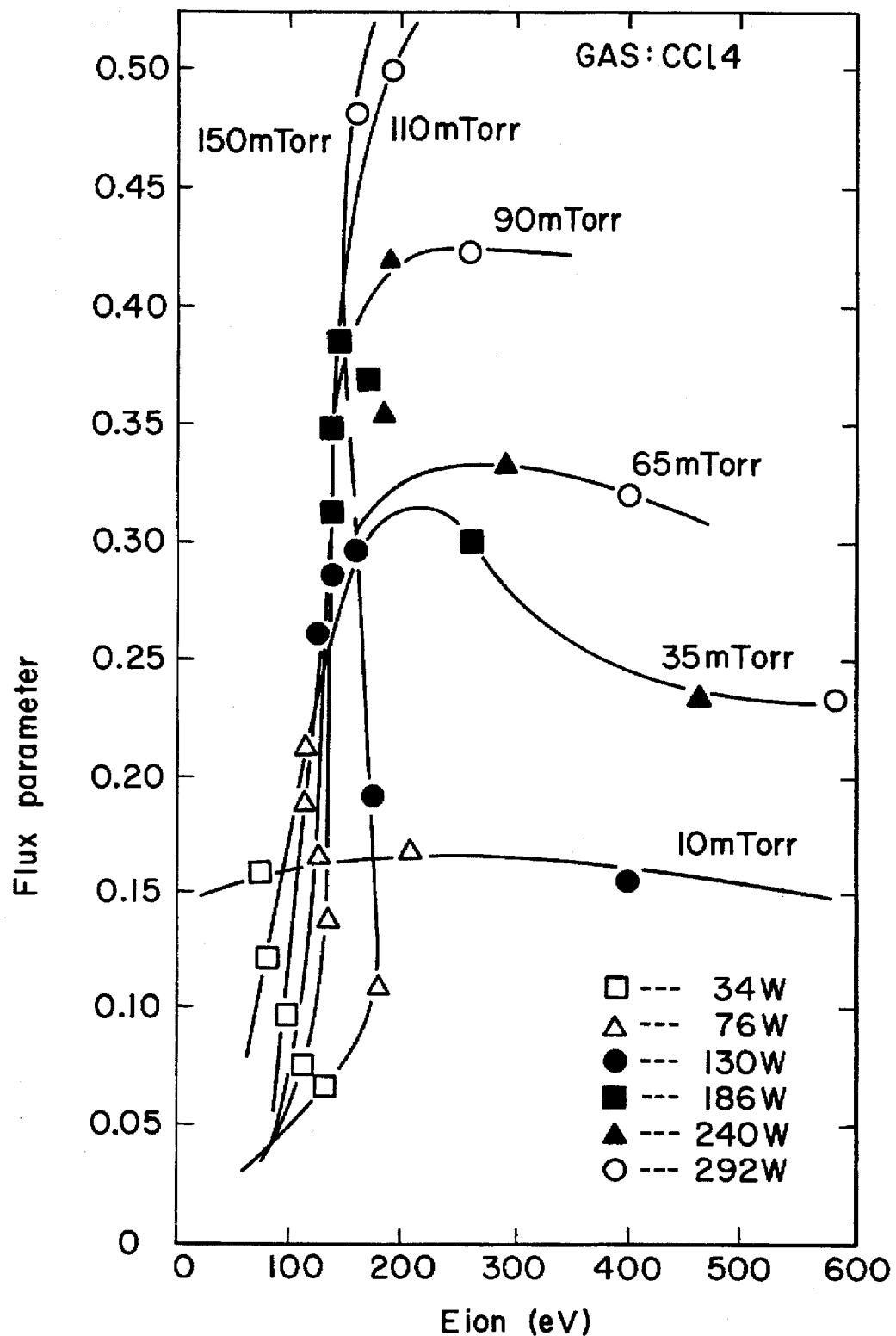
FIG. 3 is a graphical representation showing a relationship between ion energy (Eion) on exciting $CCl_4$ and a flux parameter.
Figure 4:
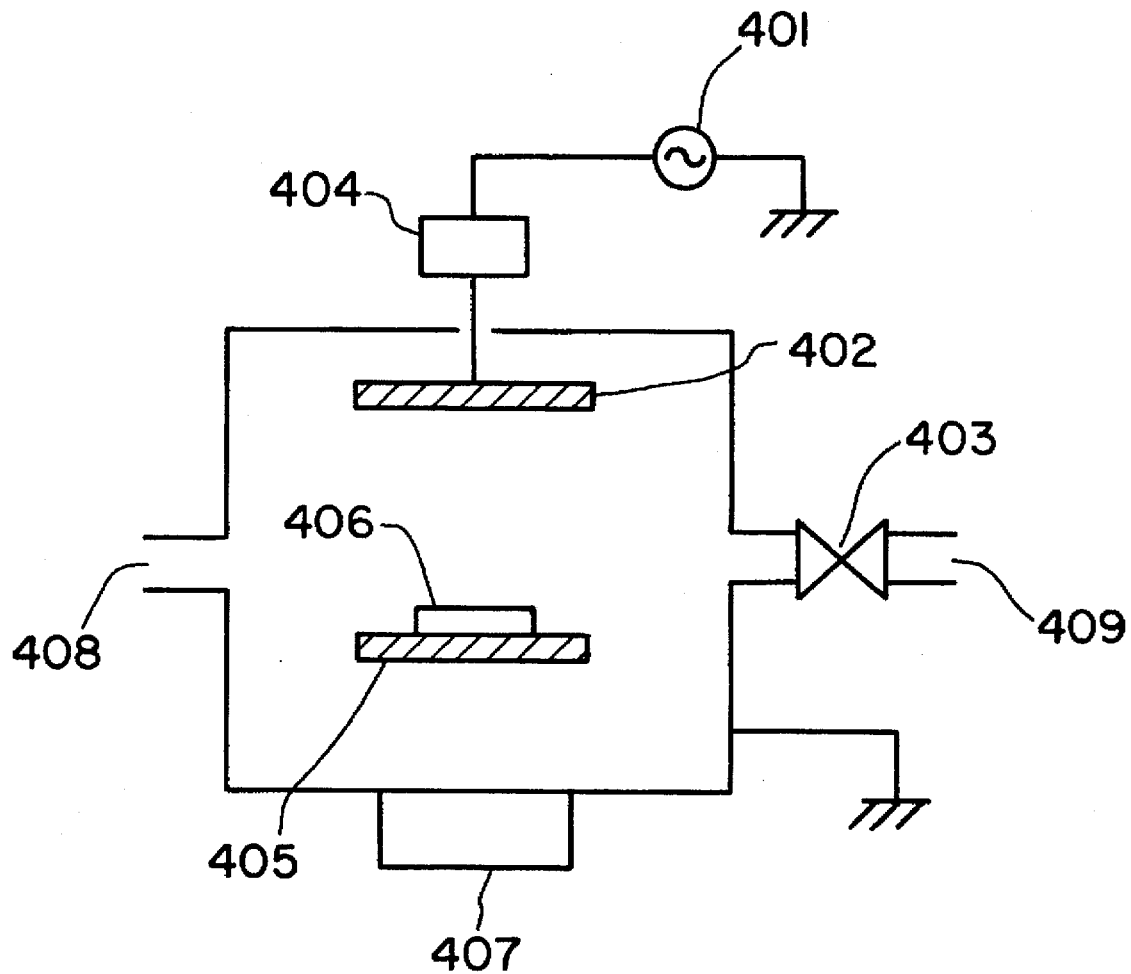
FIG. 4 is a typical view of the vacuum vessel of the semiconductor process apparatus according to the prior art.

In the first embodiment, $CF_4$ is used as an introducing gas from the gas inlet 103. However, in the invention, halogen group atoms such as F, Cl, and Br or inert gases similar thereto may preferably be utilized. In particular, with respect to gases such as $CCl_4$ having a smaller binding energy of gas molecules (preferably, equal to or less than 4 eV/Molecule) from among gases, as shown in FIG. 3, a flux parameter expressing a largeness of ion density increases, although the ion energy (Eion) is hardly varied within a range of low value, when the high-frequency electric power is allowed to gradually increase under the condition of a cleaning process pressure equal to or more than 110 mtorr, such as when plasma is generated by applying the high-frequency electric power having a frequency of 13.56 MHz. The same tendency as described above is obtained in the case of 100 MHz or more. Accordingly, it is possible to raise only the ion density while the ion energy remains kept at a low value when the high-frequency electric power is increased for effectively performing the cleaning process. Thus, in the cleaning process, impurities on surfaces are effectively removed without damage to, for example, the oxide passivation skin film which is exposed to the plasma which is provided on an inside surface of a vacuum tube or on a front surface of an electrode. For gases other than $CCl_4$ gas, there can be provided $SF_6$, $PCl_3$, $NF_3$, HBr, HI, and $Br_2$.

The flux parameter is defined by the following equation (see Japanese Patent Application Hei-2-252847 in 1990), $$Flux = Pwrf/Vpp$$

where Pwrf represents a high-frequency electric power supplied to an electrode, and Vpp represents a high-frequency amplitude in the electrode.

In the first embodiment, copper is used for the coil 110 made of copper wire with a diameter of 1 mm, a coil radius of 25 mm, a coil length of 300 mm and 145 coil turns. However, in the invention, other materials and optional shapes for the coil may preferably be used depending on utilizations. Essentially the invention disclosed that when connecting the turn switch 114 to the coil 110 side, an impedance between the lower electrode and the earth may preferably be larger than that between the upper electrode and the earth. In the first embodiment, the fixed type is used for the coil inductance. However in the invention, a variable type of coil inductance may preferable be utilized.

The cleaning process of the embodiment may preferably be performed, immediately after wafer processing, every time after the wafer is carried to a vacuum vessel connected through the gate valve to the vacuum vessel 108. In this process, the same conditions within the vacuum vessel 108 are maintained at every time immediately before wafer processing, hence, stable wafer processing is possible. The cleaning may preferably be performed after several sheets of wafers have been processed.

In the first embodiment, a wafer process, for example, a sputtering process of silicon, is performed, and in the cleaning process, accumulated substances of silicon adhered to the inside surface of the vacuum vessel is removed. However, in the invention, other wafer processes, for example, a process such as CVD process or RIE process may preferably be performed to remove accumulated substances, for example, Si, $SiO_2$, fluorine compound, and carbon compound, which have been adhered to the inside surface of the vacuum vessel.

Figure 2:
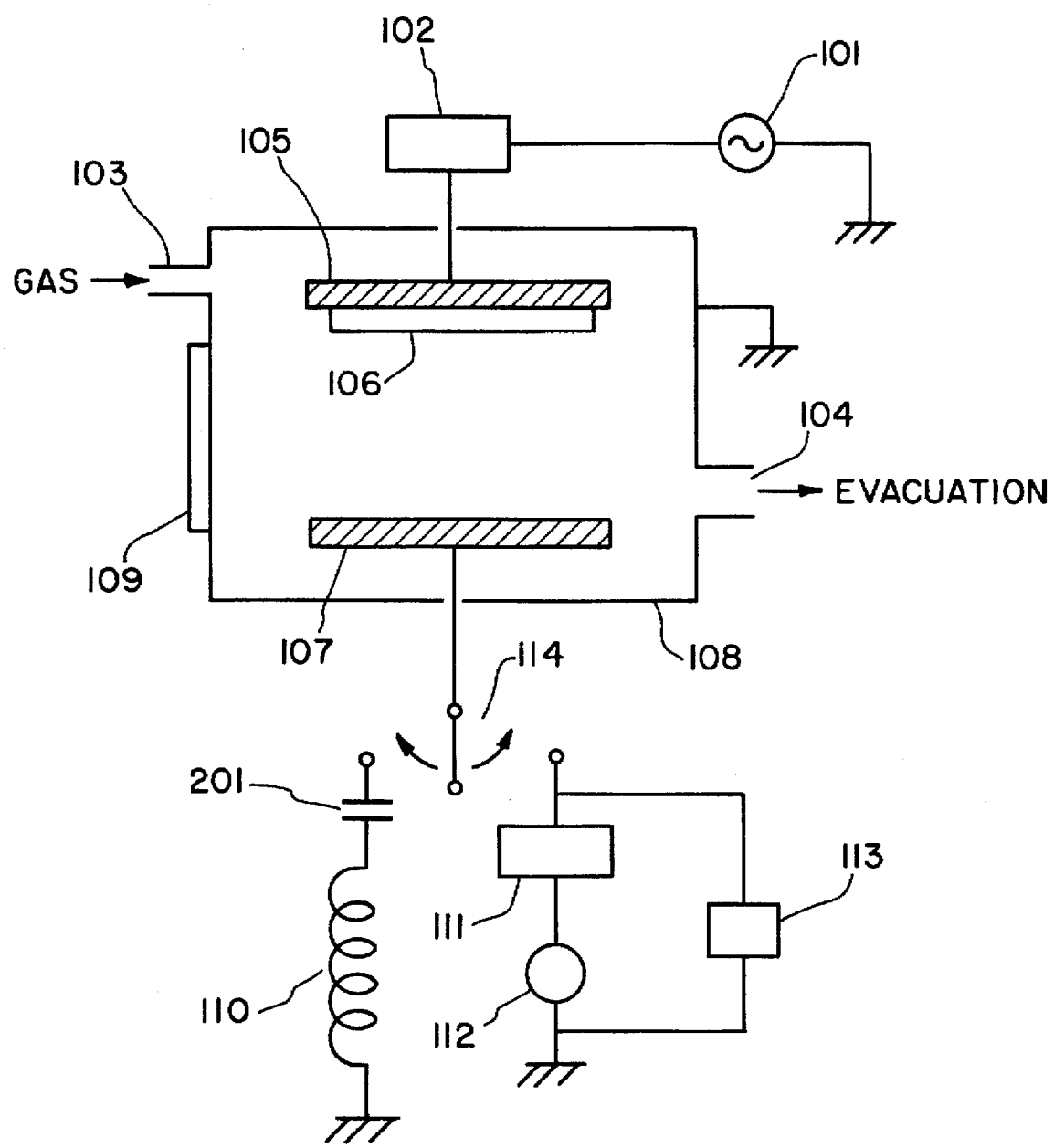
FIG. 2 is a typical view of a vacuum vessel of a semiconductor process apparatus according to a second embodiment.

FIG. 2 shows a second embodiment.

This embodiment corresponds to the first embodiment, however a capacitor 201 is inserted between the coil 110 and the second electrode 107. Where the other construction is the same as in the first embodiment, the explanation thereof will be omitted.

The capacitor 201 with a capacitance of 10 pF is used. As is the case of the first embodiment, when plasma is generated in the vacuum vessel 108, the plasma spreads enough into the vacuum vessel 108, and impurities adhered to every nook and corner on the surface can be removed.

In this embodiment, the capacitor 201 with a capacitance of 10 pF is used. However in the invention, other optional fixed valued capacitances or a variable capacitances may preferable be utilized. The essential feature is that, when connecting the turn switch 114 with the coil 110, an impedance between the lower electrode and the earth may preferably be made larger than an impedance between the upper electrode and the earth.

Furthermore, in this embodiment, the coil and the capacitor are connected in series with each other. However in the invention, a parallel circuit therefor may be available.

I claim:

1. An apparatus comprising:

a vessel having interior surfaces;

first and second electrodes disposed in said vessel wherein the first electrode is characterized by an impedance between said first electrode and earth;

a first high-frequency electric power supply connected to said first electrode;

a second high frequency electric power supply;

a means for holding a wafer disposed on said second electrode;

a gas supply for introducing gas into said vessel, wherein said gas is capable of being turned into a plasma;

an impedance means having an impedance wherein the impedance of said impedance means is larger than the impedance between said first electrode and earth; and means for connecting said impedance means and said second high frequency power supply to said second electrode, said connecting means comprising a switch capable of alternatively connecting one of said second high frequency power supply and said impedance means to said second electrode at a time such that the plasma generated in the vessel is capable of cleaning the interior surfaces of the vessel when said switch connects said impedance means to said second electrode and such that the plasma generated in the vessel is capable of sputtering a target provided on one of the electrodes onto a substrate provided on the other electrode when the switch connects the second high frequency power supply to the second electrode, and wherein said first high-frequency power supply is capable of using a first frequency when the switch connects the impedance means to the second electrode and a second frequency when the switch connects said second high frequency power supply to the second electrode, wherein the first frequency is higher than the second frequency.

2. A process apparatus in accordance with claim 1 wherein said impedance means comprises one of a coil and a combination of a coil and a capacitor.

3. A process apparatus in accordance with claim 1 wherein said gas is selected from the group consisting of an inert gas and a gas comprising a halogen group atom, wherein said halogen group atom is selected from the group consisting of F, Cl, and Br.

4. A process apparatus in accordance with claim 1, wherein the second high frequency power supply is capable of using a third frequency when the switch connects the second high frequency power supply to the second electrode, and wherein the second frequency is equal to 1 to 15 MHz, and the third frequency is equal to 10 to 50 MHz.

5. A process apparatus in accordance with claim 1, wherein the second high frequency power supply is capable of using a third frequency when the switch connects the second high frequency power supply to the second electrode, and wherein the second frequency is equal to 1 to 15 MHz, and the third frequency is equal to 30 to 50 MHz.

6. A process apparatus in accordance with claim 1, wherein the first frequency is at least about 100 MHz.

* * * * *